United States Patent
Zeng

(10) Patent No.: US 9,888,587 B2
(45) Date of Patent: Feb. 6, 2018

(54) CURVATURE REMOTELY ADJUSTABLE CURVED-SURFACE DISPLAY DEVICE

(71) Applicant: WUHAN CHINA STAR OPTOELECTRONICS TECHNOLOGY CO., LTD., Wuhan, Hubei (CN)

(72) Inventor: Jie Zeng, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 459 days.

(21) Appl. No.: 14/905,530

(22) PCT Filed: Dec. 23, 2015

(86) PCT No.: PCT/CN2015/098409
§ 371 (c)(1),
(2) Date: Jan. 15, 2016

(87) PCT Pub. No.: WO2017/059631
PCT Pub. Date: Apr. 13, 2017

(65) Prior Publication Data
US 2017/0238429 A1    Aug. 17, 2017

(30) Foreign Application Priority Data

Oct. 9, 2015   (CN) .......................... 2015 1 0647823

(51) Int. Cl.
*H05K 5/00*    (2006.01)
*G09F 9/30*    (2006.01)
*H05K 5/02*    (2006.01)

(52) U.S. Cl.
CPC ........... *H05K 5/0017* (2013.01); *G09F 9/301* (2013.01); *H05K 5/0217* (2013.01)

(58) Field of Classification Search
CPC ..... H05K 5/0217; H05K 5/0017; G09F 9/301
USPC ........................................ 361/807, 809, 810
See application file for complete search history.

(56) References Cited

U.S. PATENT DOCUMENTS

| 9,081,540 B1 | 7/2015 | Cho et al. |
| 9,182,620 B1* | 11/2015 | Yu .......................... G06F 1/1601 |
| 9,307,658 B2* | 4/2016 | Song .................... H05K 5/0217 |
| 9,645,605 B2* | 5/2017 | Park ......................... H04N 5/64 |
| 2012/0224347 A1* | 9/2012 | Hayakawa ............. F16M 11/08 361/807 |

(Continued)

FOREIGN PATENT DOCUMENTS

| CN | 103941456 A | 7/2014 |
| CN | 104766543 A | 7/2015 |
| CN | 204516279 U | 7/2015 |

*Primary Examiner* — Hung S Bui
(74) *Attorney, Agent, or Firm* — Ladas & Parry LLP

(57) ABSTRACT

The curvature remotely adjustable curved-surface display device of the present invention has a remotely controllable motor, an active rod, and a slave rod deployed therein. The active rod has a gear and the first slave rod has a rack bar. When receiving a remote control signal transmitted from a remote terminal, the remotely controllable motor can actuate the gear on the active rod to rotate such that the active rod and the first slave rod move close to each other or away from each other. Such a process applies forces to the display panel, thereby carrying out remotely controlling the curvature of the display panel.

14 Claims, 5 Drawing Sheets

(56) References Cited

U.S. PATENT DOCUMENTS

| | | | |
|---|---|---|---|
| 2015/0009635 A1 | 1/2015 | Kang et al. | |
| 2015/0035812 A1 | 2/2015 | Shin et al. | |
| 2015/0185761 A1* | 7/2015 | Song | G06F 1/1601 361/679.21 |
| 2015/0195932 A1* | 7/2015 | Lee | H05K 5/0217 361/749 |
| 2015/0331273 A1 | 11/2015 | Yu et al. | |
| 2016/0127674 A1* | 5/2016 | Kim | G09G 5/003 348/739 |
| 2016/0295711 A1* | 10/2016 | Ryu | G09F 9/301 |

* cited by examiner

CURVATURE REMOTELY ADJUSTABLE CURVED-SURFACE DISPLAY DEVICE

TECHNICAL FIELD OF THE INVENTION

The present invention relates to a curved-surface display device, and more particularly, to a curvature remotely adjustable curved-surface display device.

BACKGROUND OF THE INVENTION

With a rapid development of display technology, a display device is larger and larger in size. Since the distances between the human eye and the respective parts on the display device are not equal to each other, the viewed planar screen image is actually "twisted" when a human being views a planar display device. This phenomenon is more serious especially when the human being views a large-size screen.

Nowadays, a curved-surface display device is brought to the market. The curvature of the screen of the curved-surface display device is approximately the same with that of the retina of human eye. Therefore, when a user located directly in the front of the curved-surface display device views the screen image displayed by the curved-surface display device, the distance between the human eye and the central area of the curved-surface display device in a horizontal direction is roughly identical to the distance between the human eye and the border area of the curved-surface display device in the horizontal direction. Since the distances between the eye and the respective pixel dots are substantially the same in viewing the screen (e.g., TV screen), the screen image can be projected to the human brain at the same angles. The curved screen of the curved-surface display device achieves an excellent viewing angle especially at the left and right sides thereof. The user can get a natural and comfortable viewing experience, the brain endures less pressure, the presence is excellent, and it is a new experience for the viewing.

Generally, the display panel is bent to a certain degree and cooperates with a curved backlight source to form the curved-surface display device. However, when the curved display panels (e.g., curved TV panels) leave the factory, most of their curvatures are set to a constant and are not adjustable. The curvatures of human eyes' retina are not completely the same and the distance between the human being and the screen is not totally fixed. It will affect the user's viewing experience if the curved-surface display device still maintains at the original curvature.

Therefore, the present invention is to develop a curvature remotely adjustable curved-surface display device for solving the problems in the existing curved-surface display devices.

SUMMARY OF THE INVENTION

The objective of present invention is to provide a curvature remotely adjustable curved-surface display device for solving that the curvature of the existing curved-surface display device is fixed and cannot be further adjusted.

To achieve the above objective, an aspect of the present invention provides a curvature remotely adjustable curved-surface display device, comprising: a display panel having a plurality of pixels used to display an image; an active rod, one end thereof being pivotally connected to a first side of the display panel and the other end thereof having a gear disposed; a first slave rod, one end thereof being pivotally connected to a second side opposite to the first side of the display panel and the other end thereof having a rack bar disposed, the gear at the other end of the active rod being engaged with the rack bar at the other end of the first slave rod; and a remotely controllable motor connecting or coupling to the gear disposed on the active rod, wherein the remotely controllable motor receives a remote control signal transmitted from a remote terminal and supplies power to the gear of the active rod based on the remote control signal so as to make the gear rotate, thereby making the first slave rod move toward or away from the active rod as a result of the engaging movement between the gear and the rack bar.

Another aspect of the present invention provides a curvature remotely adjustable curved-surface display device, comprising: a display panel having a plurality of pixels used to display an image; an active rod, one end thereof being pivotally connected to a first side of the display panel and the other end thereof having a gear disposed; a first slave rod, one end thereof being pivotally connected to a second side opposite to the first side of the display panel and the other end thereof having a rack bar disposed, the gear at the other end of the active rod being engaged with the rack bar at the other end of the first slave rod; a second slave rod, one end thereof being pivotally connected between the first side and the second side of the display panel and the other end thereof being pivotally connected to the first slave rod; and a remotely controllable motor connecting or coupling to the gear disposed on the active rod, wherein the remotely controllable motor receives a remote control signal transmitted from a remote terminal and supplies power to the gear of the active rod based on the remote control signal so as to make the gear rotate, and wherein when the remotely controllable motor actuates the gear of the active rod to rotate along a first direction, the first slave rod moves toward the active rod and the display panel is applied with an inward pulling force such that the curvature of the display panel is increased; when the remotely controllable motor actuates the gear of the active rod to rotate along a second direction, the first slave rod moves away from the active rod and the display panel is applied with an outward pushing force such that the curvature of the display panel is decreased.

A further aspect of the present invention provides a curvature remotely adjustable curved-surface display device, comprising: a display panel having a plurality of pixels used to display an image; an active rod, one end thereof being pivotally connected to a first side of the display panel and the other end thereof having a gear disposed; a first slave rod, one end thereof being pivotally connected to a second side opposite to the first side of the display panel and the other end thereof having a rack bar disposed, the gear at the other end of the active rod being engaged with the rack bar at the other end of the first slave rod; a second slave rod, one end thereof being pivotally connected between the first side and the second side of the display panel and the other end thereof being pivotally connected to the first slave rod; and a remotely controllable motor connecting or coupling to the gear disposed on the active rod, wherein the remotely controllable motor receives a remote control signal transmitted from a remote terminal and supplies power to the gear of the active rod based on the remote control signal so as to make the gear rotate, thereby making the first slave rod move toward or away from the active rod as a result of the engaging movement between the gear and the rack bar, and wherein the second slave rod pushes the display panel outward when the active rod and the first slave rod apply an inward pulling force to the display panel; the second slave rod pulls the display panel inward when the active rod and the first slave rod apply an outward pushing force to the display panel.

The curvature remotely adjustable curved-surface display device of the present invention has the remotely controllable motor, the active rod, and the first slave rod (and the second slave rod) deployed therein. The active rod has the gear and the first slave rod has the rack bar. The remotely controllable motor and the gear on the active rod are connected or coupled to each other. Therefore, when receiving a remote control signal transmitted from a remote terminal, the remotely controllable motor can actuate the gear on the active rod to rotate clockwise or counterclockwise such that the active rod and the first slave rod move close to each other or away from each other. Such a process applies forces to the display panel and the second slave can also apply a force to the display panel, thereby carrying out remotely controlling the curvature of the display panel.

To make above content of the present invention more easily understood, it will be described in details by using preferred embodiments in conjunction with the appending drawings.

DETAILED DESCRIPTION OF THE INVENTION

To make the objectives, technical schemes, and effects of the present invention more clear and specific, the present invention is described in further detail below with reference to the embodiments in accompanying with drawings. It should be understood that the specific embodiments described herein are merely for explaining the present invention, the term "embodiment" used in the context means an example, instance, or illustration, and the present invention is not limited thereto. Also, in the appending drawings, the elements with similar or identical structures or functions are indicated by a same number.

Figure 1:
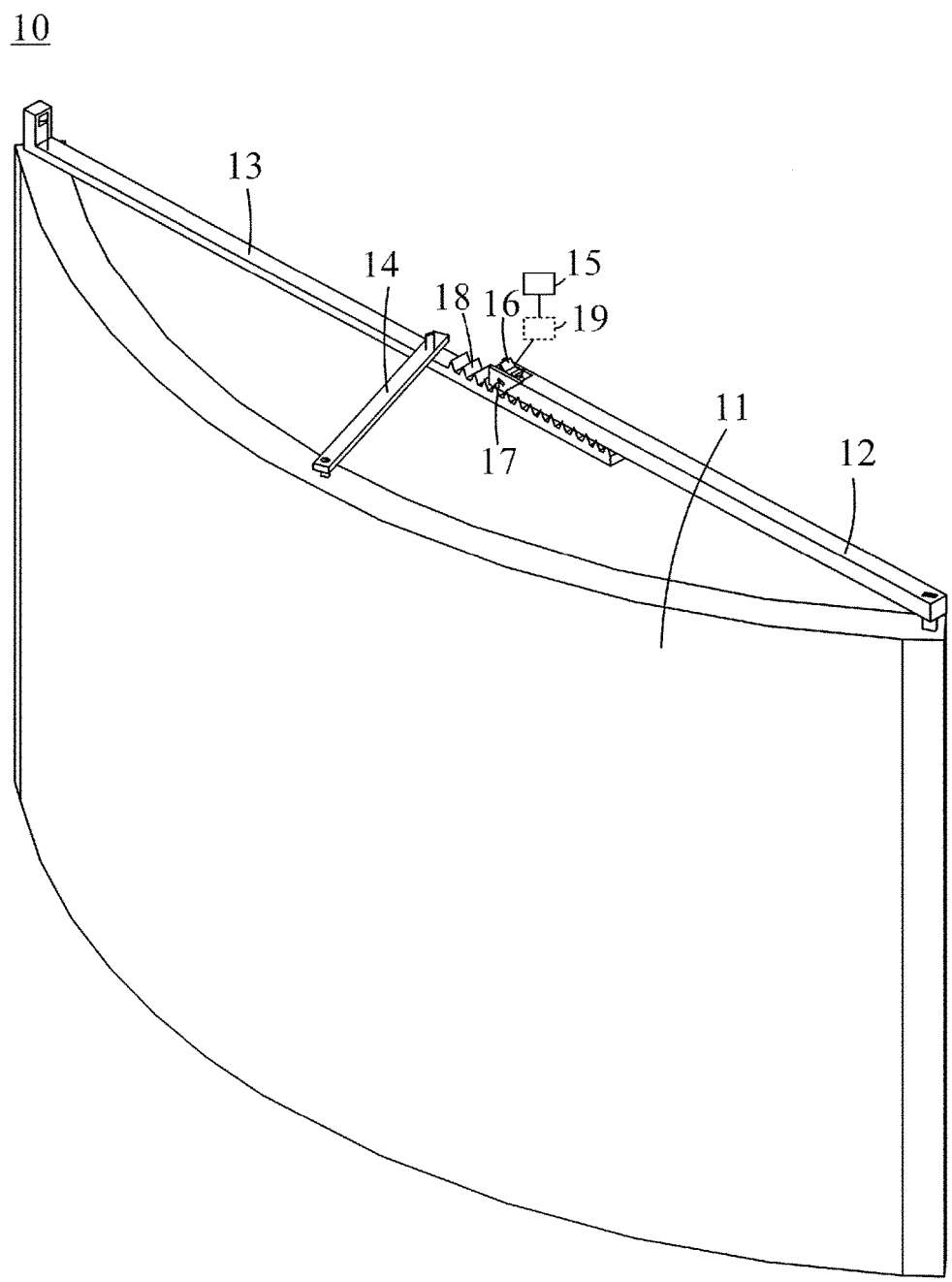
FIG. 1 is a schematic diagram showing a curvature remotely adjustable curved-surface display device in accordance with the present invention.
Figure 2:
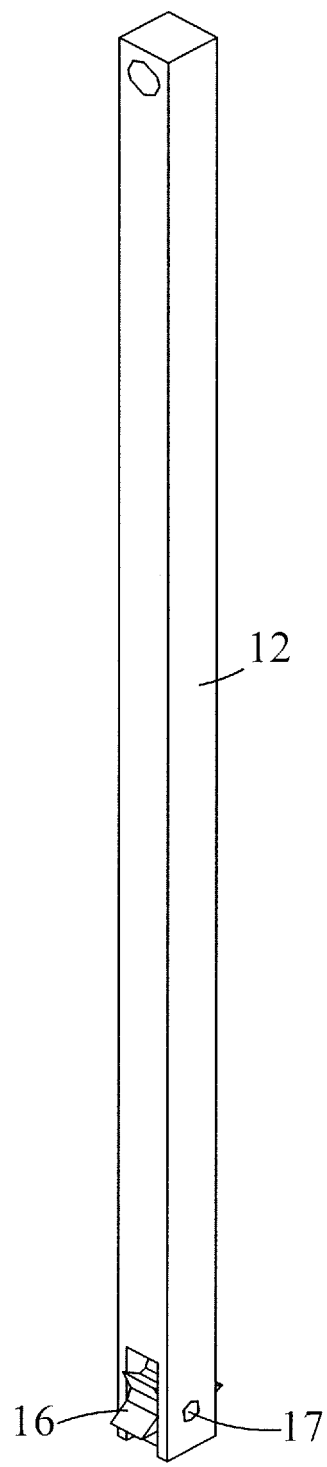
FIG. 2 is an enlarged view of an active rod 12 shown in FIG. 1.
Figure 3:
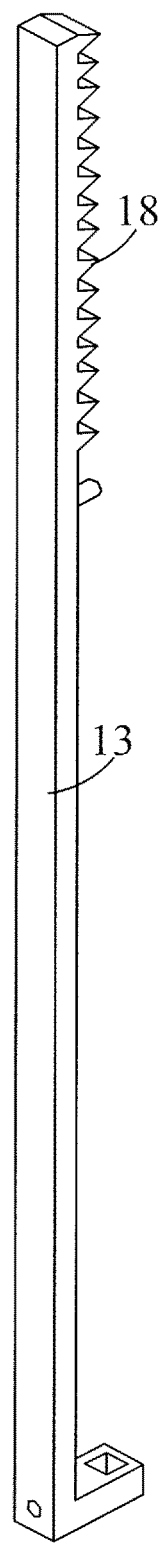
FIG. 3 is an enlarged view of a first slave rod 13 shown in FIG. 1.

Please refer to FIG. 1, FIG. 2, and FIG. 3. FIG. 1 is a schematic diagram showing a curvature remotely adjustable curved-surface display device in accordance with the present invention. FIG. 2 is an enlarged view of an active rod 12 shown in FIG. 1. FIG. 3 is an enlarged view of a first slave rod 13 shown in FIG. 1. The curvature remotely adjustable curved-surface display device 10 of the present invention comprises a display panel (or curved-surface display panel) 11, an active rod 12, a first slave rod 13, a second slave rod 14, and a remotely controllable motor (or remotely controllable electromotor) 15, and can also comprise a transmission mechanism 19 for transferring the power provided by the remotely controllable motor 15.

The display panel 11 is used to display an image and has a plurality of pixels disposed thereon. Preferably, in a practical application, the display panel 11 may be a large-size, high resolution display panel such as 4K2K TV panel. The display panel 11 can be a planar plate and is then adjusted to a curved panel by using the device of the present invention. The display panel 11 can also be a curved panel and its curvature is then further adjusted by using the device of the present invention. The active rod 12, the first slave rod 13, and the second slave rod 14 are long rigid rods, and the lengths of which are apparently greater than the widths and heights. They generally are not ductile or their ductility is negligible in the structure. Their materials can be, for example, hard plastic, native wood or reclaimed wood, metal, or other materials easy to be shaped. The remotely controllable motor 15 can receive a remote control signal transmitted from a remote terminal and can operate based on this signal. The remotely controllable motor 15 can be a general electromotor generating a rotation motion, or preferably a stepping motor generating a linear motion. The present invention is not limited to the types of motions generated by the remotely controllable motor 15. Depending on the circumstances, the curvature remotely adjustable curved-surface display device 10 of the present invention can also comprise the transmission mechanism 19, which is connected or coupled to the remotely controllable motor 15 for transferring the power generated by the remotely controllable motor 15, and can also be used to transform the type of motion generated by the remotely controllable motor 15. Generally, the transmission mechanism 19 may comprise a plurality of gears (not shown).

The active rod 12, the first slave rod 13, and the second slave rod 14 can be deployed at the upper edge of the display panel 11 (corresponding to the top edge of the display panel 11), and can also be deployed at the lower edge (corresponding to the bottom edge of the display panel 11) of the display panel 11. Preferably, the upper edge and the lower edge of the display panel 11 respectively has a set of the active rod 12, the first slave rod 13, and the second slave rod 14 disposed thereon. In this way, the up-down symmetric forces can make the curvatures of the top edge and the bottom edge of the display panel 11 be in consistent with each other when the curvature of the display panel 11 is adjusted. The following is described with arranging the active rod 12, the first slave rod 13, the second slave rod 14 at the upper edge of the display panel 11 and it should be understood that the present invention is not limited thereto.

As shown in FIG. 1, the active rod 12 has one end pivotally connecting to a first side (e.g., the vertex in the upper right) of the display panel 11, the first slave rod 13 has one end pivotally connected to a second side (e.g., the vertex in the upper left) opposite to the first side of the display panel 11, and the second slave rod 14 has one end pivotally connecting to a position (e.g., on the top edge or a center of curvature on the top edge of the display panel 11) between the first side and the second side of the display panel 11, thereby the active rod 12, the first slave rod 13, and the second slave rod 14 can respectively pivot on the pivot point on the display panel 11.

The other end of the active rod 12 has a gear 16 disposed. The gear 16 can rotate about an axis 17. The axis 17 is perpendicular to the lengthwise direction of the active rod 12. The other end of the first slave rod 13 has a rack bar 18 disposed. The gear 16 of the active rod 12 is engaged with the rack bar 18 of the first slave rod 13. Therefore, when the gear 16 of the active rod 12 rotates about the axis 17, the gear 16 can move on the rack bar 18 of the first slave rod 13. In such a manner, the active rod 12 and the first slave rod 13 can move close to each other or move away from each other. The other end of the second slave rod 14 is pivotally connected to the first slave rod 13, and thus the second slave rod 14 spans between the display panel 11 and an extending direction of the active rod 12 and the first slave rod 13.

In one embodiment, as shown in FIG. 1, the active rod 12 is located at an upper position and the first slave rod 13 is located at a lower position, and teeth of the rack bar 18 on the first slave rod 13 is facing upward and the gear 16 on the active rod 12 is placed downward to be engaged with the teeth of the rack bar 18 on the first salve rod 13. Since the first slave rod 13 and the second slave rod 14 are pivotally connected to each other, the first slave rod 13 provides a certain degree of support for the active rod 12 located above the first slave rod 13, thereby providing certain stability for the entire structure.

The remotely controllable motor 15 is connected or coupled to the gear 16 on the active rod 12. A user can remotely control the remotely controllable motor 15 in the surroundings of the curved-surface display device. The remotely controllable motor 15 receives a remote control signal transmitted from a remote terminal and supplies power based on the remote control signal. The power is transferred to the gear 16 of the active rod 12 so as to make the gear 16 of the active rod 12 rotate. Based on the remote control signal, the remotely controllable motor 15 can also actuate the gear 16 on the active rod 12 to rotate along different directions, for example, a clockwise direction and a counterclockwise direction. When the gear 16 on the active rod 12 rotates clockwise (on a basis of a direction penetrating the paper) about the axis 17, the gear 16 on the active rod 12 moves toward the right side along the rack bar 18 of the first slave rod 13 and meanwhile, the active rod 12 and the first slave rod 13 move away from each other, the curvature of the display panel 11 is decreased, and the display panel 11 becomes less curved. When the gear 16 on the active rod 12 rotates counterclockwise (on a basis of a direction penetrating the paper) about the axis 17, the gear 16 on the active rod 12 moves toward the left side along the rack bar 18 of the first slave rod 13 and meanwhile, the active rod 12 and the first slave rod 13 move close to each other, the curvature of the display panel 11 is increased, and the display panel 11 becomes more curved.

The length of the second slave rod 14 pivotally connected to the first slave rod 13 is fixed. The second slave rod 14 can apply an auxiliary force in adjusting the curvature of the display panel 11. The second slave rod 14 can also increase the stability of applying forces by the active rod 12 and the first slave rod 13 to the display panel 11. In addition, the remotely controllable motor 15 can be connected to the gear 16 on the active rod 12 via the transmission mechanism 19. In this way, the remotely controllable motor 15 can be deployed at a position easy to receive the remote control signal, and thus it is more smooth for user manipulation.

The following further explains the principles of the curvature remotely adjustable curved-surface display device of the present invention. During the process of increasing the curvature of the display panel 11, the remotely controllable motor 15 receives a remote control signal transmitted from a remote terminal by a user and actuates, according to the remote control signal, the gear 16 on the active rod 12 to rotate about the axis 17 along a first direction (e.g., a counterclockwise direction), the gear 16 on the active rod 12 drives, via the rack bar 18 of the first slave rod 13, the first slave rod 13 to move toward the active rod 12, and meanwhile the active rod 12 and the first slave rod 13 move close to each other and pull the two sides of the display panel 11 toward the center, thereby the curvature of the display panel 11 is increased. Meanwhile, the second slave rod 14 pivots on a pivot point of the display panel and the second slave rod 14 and thus applies an outward pushing force to the pivot point, and this also contributes the curvature decrease increase of the display panel 11. In such a manner, all the acting forces including the pulling forces applied to the two sides of the display panel 11 by the active rod 12 and the first slave rod 13 and the pushing force applied to the center of curvature of the display panel 11 by the second slave rod 14 are forces making the curvature of the display panel 11 decrease increase, thereby improving the efficiency of applied forces.

Similarly, during the process of decreasing the curvature of the display panel 11, the remotely controllable motor 15 receives a remote control signal transmitted from a remote terminal by a user and actuates, according to the remote control signal, the gear 16 on the active rod 12 to rotate about the axis 17 along a second direction (e.g., a clockwise direction), the gear 16 on the active rod 12 drives, via the rack bar 18 of the first slave rod 13, the first slave rod 13 to move away from the active rod 12, and meanwhile the active rod 12 and the first slave rod 13 move away from each other and push the two sides of the display panel 11 outward, thereby the curvature of the display panel 11 is decreased. Meanwhile, the second slave rod 14 pivots on a pivot point of the display panel and the second slave rod 14 and thus applies an inward pulling force to the pivot point, and this also contributes the curvature decrease of the display panel 11. In such a manner, all the acting forces including the pushing forces applied to the two sides of the display panel 11 by the active rod 12 and the first slave rod 13 and the pulling force applied to the center of curvature of the display panel 11 by the second slave rod 14 are forces making the curvature of the display panel 11 decrease, thereby improving the efficiency of applied forces.

Figure 4:
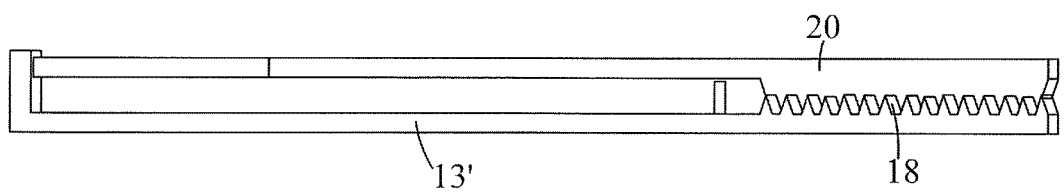
FIG. 4 is a schematic diagram showing an example of a first slave rod of a curvature remotely adjustable curved-surface display device in accordance with the present invention.

Please refer to FIG. 4, which is a schematic diagram showing a first slave rod 13' of a curvature remotely adjustable curved-surface display device in accordance with the present invention. In this embodiment, one end of the first slave rod 13' has a rack bar 18 disposed. The first slave rod 13' also has a covering body 20, which encapsulates the gear 16 on the active rod 12 such that the kinetic energy transmission is more stable, avoiding exposing the transmission parts. In addition, the covering body 20 can be extended to the other end of the first slave rod 13', as shown in FIG. 4.

Figure 5:
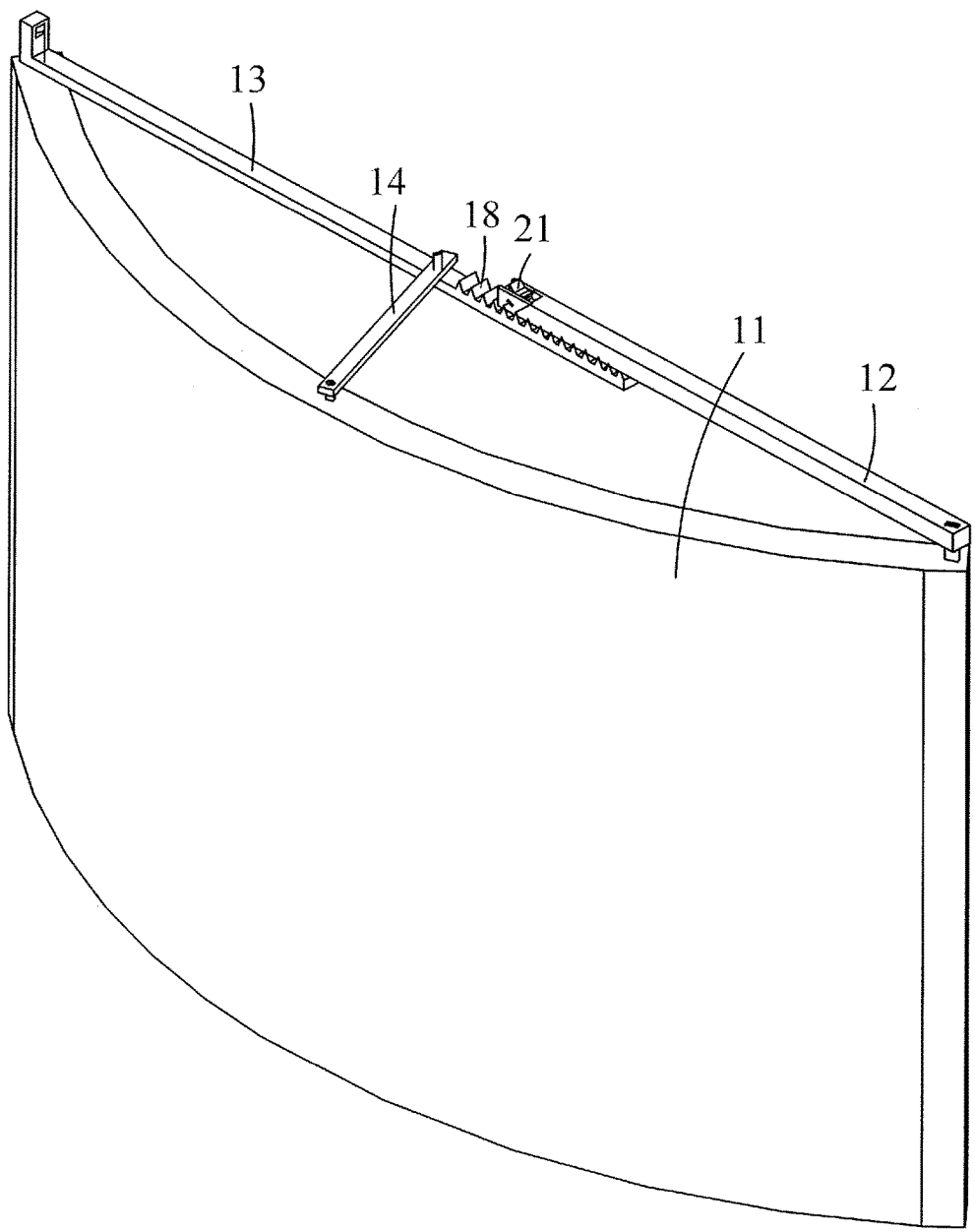
FIG. 5 is a schematic diagram showing a curvature remotely adjustable curved-surface display device in accordance with another embodiment of the present invention.

Please refer to FIG. 5, which is a schematic diagram showing a curvature remotely adjustable curved-surface display device in accordance with another embodiment of the present invention. Different from the afore-described curvature remotely adjustable curved-surface display device 10, in the present embodiment, the aforesaid remotely controllable motor 15 and gear 16 can be integrated into one unity, forming a new element, i.e., a driving part 21. That is, the remotely controllable motor 15 and the gear 16 can be integrated into a single element, which is then disposed on the first slave rod 13. This can simplify the assembling process and it is workable in practice.

The curvature remotely adjustable curved-surface display device 10, 10' of the present invention has the remotely controllable motor 15, the active rod 12, and the first slave rod 13, 13' (and the second slave rod 14) deployed therein. The active rod 12 has the gear 16 and the first slave rod 13, 13' has the rack bar 18. The remotely controllable motor 15 and the gear 16 on the active rod 12 are connected or coupled to each other. Therefore, when receiving a remote control signal transmitted from a remote terminal, the remotely controllable motor 15 can actuate the gear 16 on the active rod 12 to rotate clockwise or counterclockwise such that the active rod 12 and the first slave rod 13, 13' move close to each other or away from each other. Such a process applies forces to the display panel and the second slave 14 can also apply a force to the display panel, thereby carrying out remotely controlling the curvature of the display panel.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A curvature remotely adjustable curved-surface display device, comprising:
    a display panel having a plurality of pixels used to display an image;
    an active rod, one end thereof being pivotally connected to a first side of the display panel and the other end thereof having a gear disposed;
    a first slave rod, one end thereof being pivotally connected to a second side opposite to the first side of the display panel and the other end thereof having a rack bar disposed, the gear at the other end of the active rod being engaged with the rack bar at the other end of the first slave rod;
    a second slave rod, one end thereof being pivotally connected between the first side and the second side of the display panel and the other end thereof being pivotally connected to the first slave rod; and
    a remotely controllable motor connecting or coupling to the gear disposed on the active rod, wherein the remotely controllable motor receives a remote control signal transmitted from a remote terminal and supplies power to the gear of the active rod based on the remote control signal so as to make the gear rotate, thereby making the first slave rod move toward or away from the active rod as a result of the engaging movement between the gear and the rack bar.

2. The curvature remotely adjustable curved-surface display device according to claim 1, wherein the first slave rod moves toward the active rod when the remotely controllable motor actuates the gear of the active rod to rotate along a first direction; the first slave rod moves away from the active rod when the remotely controllable motor actuates the gear of the active rod to rotate along a second direction.

3. The curvature remotely adjustable curved-surface display device according to claim 1, wherein the display panel is applied with an inward pulling force such that the curvature of the display panel is increased when the first slave rod moves toward the active rod; the display panel is applied with an outward pushing force such that the curvature of the display panel is decreased when the first slave rod moves away from the active rod.

4. The curvature remotely adjustable curved-surface display device according to claim 1, wherein the second slave rod pushes the display panel outward when the active rod and the first slave rod apply the inward pulling force to the display panel; the second slave rod pulls the display panel inward when the active rod and the first slave rod apply the outward pushing force to the display panel.

5. The curvature remotely adjustable curved-surface display device according to claim 1, wherein the length of the second slave rod is fixed.

6. The curvature remotely adjustable curved-surface display device according to claim 1, wherein teeth of the rack bar on the first slave rod is facing upward and the gear on the active rod is placed downward to be engaged with the teeth of the rack bar on the first salve rod.

7. A curvature remotely adjustable curved-surface display device, comprising:
    a display panel having a plurality of pixels used to display an image;
    an active rod, one end thereof being pivotally connected to a first side of the display panel and the other end thereof having a gear disposed;
    a first slave rod, one end thereof being pivotally connected to a second side opposite to the first side of the display panel and the other end thereof having a rack bar disposed, the gear at the other end of the active rod being engaged with the rack bar at the other end of the first slave rod;
    a second slave rod, one end thereof being pivotally connected between the first side and the second side of the display panel and the other end thereof being pivotally connected to the first slave rod; and
    a remotely controllable motor connecting or coupling to the gear disposed on the active rod, wherein the remotely controllable motor receives a remote control signal transmitted from a remote terminal and supplies power to the gear of the active rod based on the remote control signal so as to make the gear rotate, and wherein when the remotely controllable motor actuates the gear of the active rod to rotate along a first direction, the first slave rod moves toward the active rod and the display panel is applied with an inward puffing force such that the curvature of the display panel is increased; when the remotely controllable motor actuates the gear of the active rod to rotate along a second direction, the first slave rod moves away from the active rod and the display panel is applied with an outward pushing force such that the curvature of the display panel is decreased.

8. The curvature remotely adjustable curved-surface display device according to claim 7, wherein during the curvature of the display panel is increasing, the second slave rod pivots on a pivot point of the display panel and the second slave rod and pushes the display panel outward; during the curvature of the display panel is decreasing, the second slave rod pivots on the pivot point of the display panel and the second slave rod and pulls the display panel inward.

9. The curvature remotely adjustable curved-surface display device according to claim 8, wherein teeth of the rack bar on the first slave rod is facing upward and the gear on the active rod is placed downward to be engaged with the teeth of the rack bar on the first salve rod.

10. A curvature remotely adjustable curved-surface display device, comprising:
    a display panel having a plurality of pixels used to display an image;
    an active rod, one end thereof being pivotally connected to a first side of the display panel and the other end thereof having a gear disposed;
    a first slave rod, one end thereof being pivotally connected to a second side opposite to the first side of the display panel and the other end thereof having a rack bar disposed, the gear at the other end of the active rod being engaged with the rack bar at the other end of the first slave rod;

a second slave rod, one end thereof being pivotally connected between the first side and the second side of the display panel and the other end thereof being pivotally connected to the first slave rod; and a remotely controllable motor connecting or coupling to the gear disposed on the active rod, wherein the remotely controllable motor receives a remote control signal transmitted from a remote terminal and supplies power to the gear of the active rod based on the remote control signal so as to make the gear rotate, thereby making the first slave rod move toward or away from the active rod as a result of the engaging movement between the gear and the rack bar, and wherein the second slave rod pushes the display panel outward when the active rod and the first slave rod apply an inward pulling force to the display panel; the second slave rod pulls the display panel inward when the active rod and the first slave rod apply an outward pushing force to the display panel.

11. The curvature remotely adjustable curved-surface display device according to claim 10, wherein the first slave rod moves toward the active rod when the remotely controllable motor actuates the gear of the active rod to rotate along a first direction; the first slave rod moves away from the active rod when the remotely controllable motor actuates the gear of the active rod to rotate along a second direction.

12. The curvature remotely adjustable curved-surface display device according to claim 10, wherein the display panel is applied with the inward pulling force such that the curvature of the display panel is increased when the first slave rod moves toward the active rod; the display panel is applied with the outward pushing force such that the curvature of the display panel is decreased when the first slave rod moves away from the active rod.

13. The curvature remotely adjustable curved-surface display device according to claim 10, wherein the length of the second slave rod is fixed.

14. The curvature remotely adjustable curved-surface display device according to claim 10, wherein teeth of the rack bar on the first slave rod is facing upward and the gear on the active rod is placed downward to be engaged with the teeth of the rack bar on the first salve rod.

* * * * *